United States Patent
Fontanesi et al.

(10) Patent No.: US 10,830,839 B2
(45) Date of Patent: Nov. 10, 2020

(54) HEV ROBUST ALGORITHMS FOR MAGNETIC SPEED SENSOR FOR ENGINE APPLICATIONS

(71) Applicant: Infineon Technologies AG, Neubiberg (DE)

(72) Inventors: Simone Fontanesi, Villach (AT); Klaus Grambichler, Velden am Woerthersee (AT); Tobias Werth, Villach (AT)

(73) Assignee: Infineon Technologies AG (DE)

( * ) Notice: Subject to any disclaimer, the term of this patent is extended or adjusted under 35 U.S.C. 154(b) by 147 days.

(21) Appl. No.: 16/140,887

(22) Filed: Sep. 25, 2018

(65) Prior Publication Data

US 2020/0096577 A1 Mar. 26, 2020

(51) Int. Cl.
*G01R 33/09* (2006.01)
*G01R 33/025* (2006.01)

(52) U.S. Cl.
CPC ........... *G01R 33/09* (2013.01); *G01R 33/025* (2013.01)

(58) Field of Classification Search
USPC ......... 324/160, 163, 166, 167, 207.2, 117 H; 73/114.25
See application file for complete search history.

(56) References Cited

U.S. PATENT DOCUMENTS

2012/0286773 A1* 11/2012 Reymond ............ G01R 33/077
324/207.2

\* cited by examiner

*Primary Examiner* — Vincent Q Nguyen
(74) *Attorney, Agent, or Firm* — Design IP

(57) ABSTRACT

Magnetic field sensors and sensing methods are provided. A magnetic sensor module is configured to measure a magnetic field whose magnitude oscillates between a first extrema and a second extrema. The magnetic sensor module includes a magnetic sensor configured to generate measurement values in response to sensing the magnetic field, and a sensor circuit. The sensor circuit is configured to generate a measurement signal based on the measurement values, compare the measurement signal to a switching threshold, generate a pulsed output signal having pulses that are generated based on the measurement signal crossing the switching threshold, measure a first characteristic of the measurement signal, update an offset of the switching threshold according to an offset update algorithm based on the measured first characteristic of the measurement signal, and selectively enable and disable the offset update algorithm based on at least a second characteristic of the measurement signal.

23 Claims, 4 Drawing Sheets

HEV ROBUST ALGORITHMS FOR MAGNETIC SPEED SENSOR FOR ENGINE APPLICATIONS

FIELD

The present disclosure relates generally to sensing a rotation speed, and, more particularly, to magnetic speed sensors.

BACKGROUND

In the field of speed sensing, a sinusoidal signal may be generated by a magnetic sensor in response to a rotation of a target object, such as a wheel, camshaft, crankshaft, or the like. The sinusoidal signal may be translated into pulses, which is further translated into a movement detection or a speed output.

One purpose of an engine speed sensor or a crankshaft sensor is to assess the speed at which the crankshaft spins. That is, it measures the speed of the crankshaft rotation. These speed sensors are electronic control devices which are used in automotive internal combustion engines. This component sends crucial information to the an Electronic Control Unit (ECU) (e.g., an engine control module (ECM)). The information from a crankshaft speed sensor is used to control the engine management, fuel injection, and ignition timing systems.

Basic timing information is sent from the crankshaft sensor to the ECU. The engine RPM (revolutions per minute), timing and firing order are determined by the information which is received from the crankshaft timing sensor. The information tells the ECM how fast the engine is running so the ignition can be advanced or retarded accordingly.

A hybrid electric vehicle (HEV) is a type of hybrid vehicle that combines a conventional internal combustion engine (ICE) system with an electric propulsion system (hybrid vehicle drivetrain). However, current magnetic speed sensors have not been designed to work in an HEV environment.

For example, while the vehicle is moving with the electric engine, the combustion engine is turned off and the crankshaft is free (or almost free) to move during this time. Due to the vibrations within the moving vehicle, the crankshaft may rotate randomly, backward and/or forward. If this free movement occurs long enough and the shaft moves continuously backward and/or forward, the speed sensor may detect maximum and minimum events.

Based on this detection, the speed sensor may adapt its switching threshold on a wrong signal. In other words, the speed sensor may updates its offset when it should not due to the movement of the crankshaft occurring while it is disengaged. This may lead to the speed sensor generating wrong pulses (too many forward or too many backward pulses) and sending misinformation to the ECU, which may further lead to a loss of sync with the crankshaft at the system level.

Therefore, an improved speed sensor capable of operating in an HEV environment may be desirable.

SUMMARY

Magnetic sensor modules, systems and methods are provided, configured to detect a rotation of an object, and more particularly, to detect a speed of rotation of an object.

Embodiments provide a magnetic sensor module configured to measure a magnetic field whose magnitude oscillates between a first extrema and a second extrema. The magnetic sensor module includes a magnetic sensor including a plurality of sensor elements configured to generate measurement values in response to sensing the magnetic field, and a sensor circuit. The sensor circuit is configured to receive the measurement values from at least one of the plurality of sensor elements, generate a measurement signal based on the measurement values received from the at least one of the plurality of sensor elements, compare the measurement signal to a switching threshold, generate a pulsed output signal having pulses that are generated based on the measurement signal crossing the switching threshold, measure a first characteristic of the measurement signal, update an offset of the switching threshold according to an offset update algorithm based on the measured first characteristic of the measurement signal, and selectively enable and disable the offset update algorithm based on at least a second characteristic of the measurement signal.

Embodiments provide a method of measuring a magnetic field whose magnitude oscillates between a first extrema and a second extrema. The method includes generating a measurement signal representing the measured magnetic field; comparing the measurement signal to a switching threshold; generating a pulsed output signal having pulses that are generated based on the measurement signal crossing the switching threshold; measure a first characteristic of the measurement signal; updating an offset of the switching threshold according to an offset update algorithm based on the measured first characteristic of the measurement signal; and selectively enabling and disabling the offset update algorithm based on at least a second characteristic of the measurement signal.

BRIEF DESCRIPTION OF THE DRAWINGS

Embodiments are described herein making reference to the appended drawings.

DETAILED DESCRIPTION

Figure 1A:
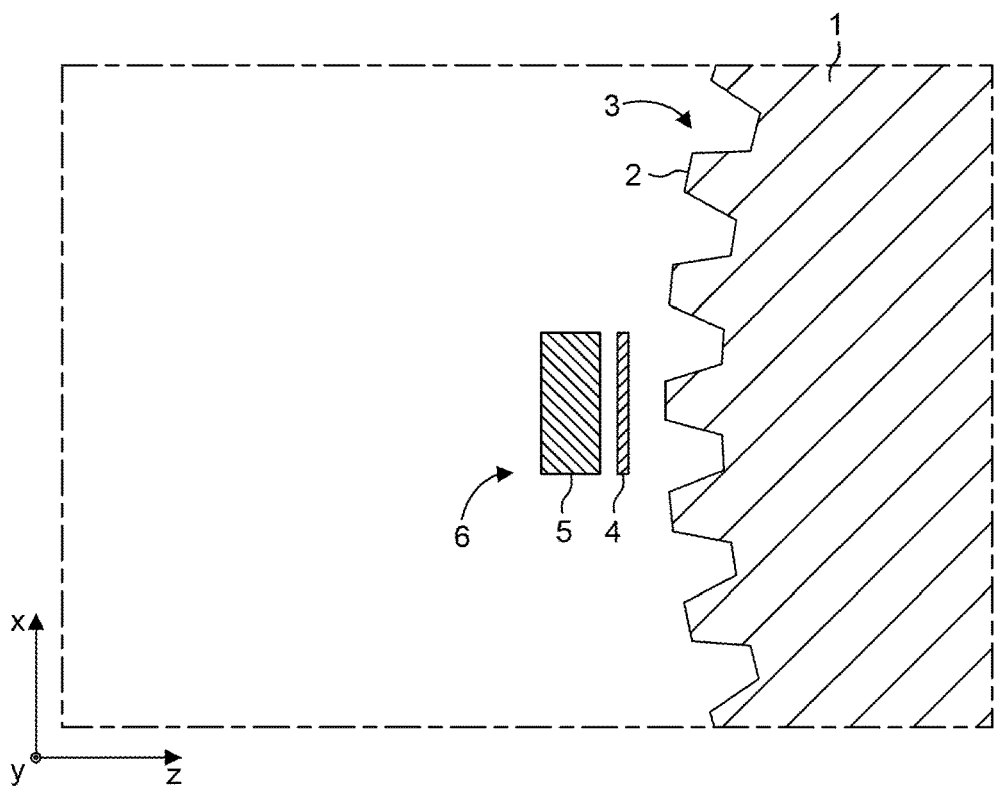
FIGS. 1A-1C illustrate a diagram of a magnetic field sensing principle using a first type of magnetic encoder according to one or more embodiments.

In the following, a plurality of details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a sensor output suitable for processing after conditioning.

Embodiments relate to sensors and sensor systems, and to obtaining information about sensors and sensor systems. A sensor may refer to a component which converts a physical quantity to be measured to an electric signal, for example, a current signal or a voltage signal. The physical quantity may for example comprise a magnetic field, an electric field, a pressure, a force, a current or a voltage, but is not limited thereto. A sensor device, as described herein, may be a current sensor, gauss meter, an angle sensor, a linear position sensor, a speed sensor, and the like.

A magnetic field sensor, for example, includes one or more magnetic field sensor elements that measure one or more characteristics of a magnetic field (e.g., an amount of magnetic field flux density, a field strength, a field angle, a field direction, a field orientation, etc.) corresponding to detecting and/or measuring the magnetic field pattern of an element that generates the magnetic field (e.g., a magnet, a current-carrying conductor (e.g. a wire), the Earth, or other magnetic field source).

According to one or more embodiments, a magnetic field sensor and a sensor circuit are both accommodated (i.e., integrated) in the same chip package (e.g., a plastic encapsulated package, such as leaded package or leadless package, or a surface mounted device (SMD)-package). This chip package is also referred to as sensor package. The sensor package may be combined with a back bias magnet to form a sensor module, sensor device, or the like.

One or more magnetic field sensor elements included in the sensor package is thus exposed to the magnetic field, and the sensor signal (e.g., a voltage signal) provided by each magnetic field sensor element is proportional to the magnitude of the magnetic field, for example. Further, it will be appreciated that the terms "sensor", "sensor element", and "sensing element" may be used interchangeably throughout this description, and the terms "sensor signal", "measurement signal", and "measurement value" may be used interchangeably throughout this description.

The sensor circuit may be referred to as a signal processing circuit and/or a signal conditioning circuit that receives the signal (i.e., sensor signal) from the magnetic field sensor element in the form of raw measurement data and derives, from the sensor signal, a measurement signal that represents the magnetic field. The sensor circuit may include an analog-to-digital converter (ADC) that converts the analog signal from the one or more sensor elements to a digital signal. The sensor circuit may also include a digital signal processor (DSP) that performs some processing on the digital signal, to be discussed below. The DSP or other processor of the sensor circuit may be configured to store an update algorithm for performing an update function based on the measurement signal. Therefore, the sensor package comprises a circuit which conditions and amplifies the small signal of the magnetic field sensor via signal processing and/or conditioning, and performs additional processing based on the measurement signal derived therefrom.

A sensor device, as used herein, may refer to a device which includes a sensor and sensor circuit as described above. A sensor device may be integrated on a single semiconductor die (e.g., silicon die or chip), although, in other embodiments, a plurality of dies may be used for implementing a sensor device. Thus, the sensor and the sensor circuit are disposed on either the same semiconductor die or on multiple dies in the same package. For example, the sensor might be on one die and the sensor circuit on another die such that they are electrically connected to each other within the package. In this case, the dies may be comprised of the same or different semiconductor materials, such as GaAs and Si, or the sensor might be sputtered to a ceramic or glass platelet, which is not a semiconductor.

Magnetic field sensor elements include, but is not limited to, Hall plates, vertical Hall effect devices, or magneto-resistive sensors, often referred to as XMR sensors which is a collective term for anisotropic magneto-resistive (AMR), giant magneto-resistive (GMR), tunneling magneto-resistive (TMR), etc.

Magnetic field sensors provided herein may be configured for speed measurements and rotation direction measurements of a rotating magnetic encoder, such as a wheel or camshaft, referred to as a target object or target wheel.

One type of magnetic encoder may be a ferromagnetic encoder, which may be a toothed wheel or a toothed disc of ferromagnetic material with holes or notches that pass in front of the magnetic field sensor. The magnetic field may be produced by a back bias magnet coupled to a back of the magnetic field sensor. Thus, the strength of the magnetic field produced by the back bias magnet is altered by the passing of teeth and notches of the rotating magnetic encoder.

For example, the sensor module is positioned in proximity to the toothed wheel, where the distance between the sensor module and the toothed wheel is defined by an air gap. The airgap changes as a tooth or notch passes by the sensor module. Due to this changing airgap, the magnetic field (flux) produced by the back bias magnet expands or contracts in time with the approaching tooth or the receding notch. This fluctuation in the magnet field is measured by the sensor module, specifically by the one or more sensor elements of the sensor module.

A second type of magnetic encoder is an encoder that consists of alternating magnets, which are magnetized in a opposite directions (e.g., alternating south-pole and north-pole magnets) and arranged along a circumference of the encoder. In this case the speed sensor is placed in front of the encoder and detects if the measured magnetic field changes its polarity. In this case, the speed sensor generates an output signal that indicates that a pole passed by.

Figure 1B:
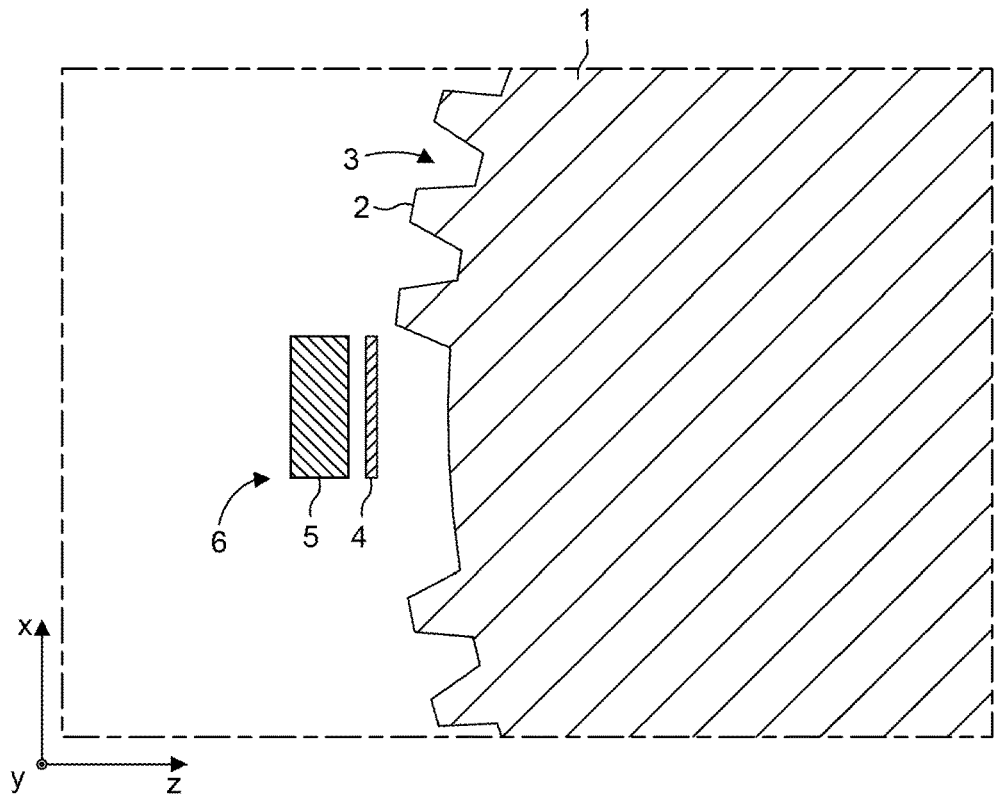
Figure 1C:
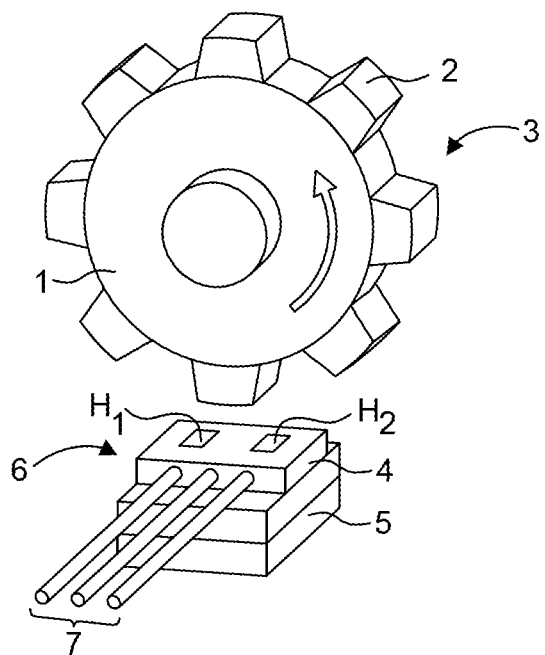

FIGS. 1A-1C illustrate a magnetic field sensing principle using a first type of magnetic encoder, a toothed wheel 1 that has alternating teeth 2 and notches 3, according to one or more embodiments. In particular, the toothed wheel 1 may be made of a ferromagnetic material (e.g., iron) that attracts magnetic fields. In addition, a sensor arrangement 4 is configured to sense a magnetic field produced by a back bias magnet 5, where the sensor arrangement 4 and the back bias magnet 5 comprise a sensor module 6. The sensor arrangement 4 may generally be referred to herein as sensor 4 and may further include a sensor circuit (not shown) and may be disposed in a sensor package.

FIGS. 1A and 1B show a tooth 2 and a notch 3 of wheel 1 passing the sensor module 6, respectively. In the instance of FIG. 1A, the magnetic field lines of the bias magnetic field produced by the back bias magnet 5 are pulled in the z-direction towards the tooth 2. Thus, the magnetic field lines are pulled away from the x and y-axes (i.e., the sensor planes of the sensor arrangement 4) and the sensed magnetic field strength in the x and y-directions is reduced such that a minimum field strength is detected at the center of the tooth 2. This may differ in real-world applications where the minimum may not occur exactly at the center due to assembly tolerances, but the minimum field strength should be detected substantially at the center of the tooth 2.

Conversely, in the instance of FIG. 1B, the magnetic field lines of the bias magnetic field produced by the back bias magnet 5 are not pulled (or are less pulled) in the z-direction towards the notch 3. Thus, the magnetic field lines remain more concentrated relative to the x and y-axes (i.e., the sensor planes of the sensor arrangement 4) and the sensed magnetic field strength in the x and y-directions are at a maximum at the center of the notch 3. This may differ in real-world applications where the maximum may not occur exactly at the center, but the maximum field strength should be detected substantially at the center of the notch 3.

FIG. 1C illustrates a schematic view of the sensor module 6 in proximity to the toothed wheel 1. The sensor module 6 includes sensor arrangement 4 having a sensor circuit (not shown) and two magnetic field sensor elements, Hall plate H1 and Hall plate H2, and a back bias magnet 5 coupled to the sensor arrangement 4. The two magnetic field sensor elements H1 and H2 may be referred to herein as differential sensor elements and are linearly aligned in a rotation direction of the toothed wheel 1. The sensor signals of each differential sensor element H1 and H2 is provided to the sensor circuit that calculates a differential measurement signal using a differential calculation that may be used to cancel out homogeneous stray-fields in the sensor plane directions.

In addition, the differential sensor elements H1 and H2 may be disposed at a distance of about half of the pitch of the teeth of the toothed wheel 1 in order to generate a differential measurement signal with high signal to noise ratio. A pitch is the distance along a pitch circle between two adjacent teeth of a toothed wheel. Lastly, leads 7 provide an electrical pathway for various input and output signals (e.g., power, command and output signals) to and from the sensor arrangement 4.

As the wheel 1 rotates, the teeth 2 and notches 3 alternate past the sensor module 6 and the sensor elements within the sensor arrangement 4 sense a change in the x-axis and y-axis magnetic field strength that varies as a sinusoidal waveform (i.e., as a signal modulation), the frequency of which corresponds to a speed of rotation of the wheel, and which further corresponds to a speed of rotation of a drive shaft (e.g., camshaft) that drives the rotation of the wheel.

Thus, the sensor circuit of the sensor arrangement 4 receives signals (i.e., sensor signals) from the magnetic field sensor elements H1 and H2 and derives, from the sensor signals, a differential measurement signal that represents the magnetic field as a signal modulation. The differential measurement signal may then be output as an output signal to an external controller, control unit, or processor (e.g., an ECU), or used internally by the sensor circuit for further processing (e.g., to generate a pulsed output signal) before being output to the external device. For example, the external device may count the pulses of the pulsed output signal and calculate a wheel-speed therefrom.

In addition, a third magnetic field sensor element (not shown) may be disposed on the sensor arrangement 4 in the middle between the two differential sensor elements H1 and H2 to enable the sensor to detection a rotational direction of the wheel 1. The Hall sensor elements may also be substituted with XMR sensor elements in all examples provided herein.

Figure 1D:
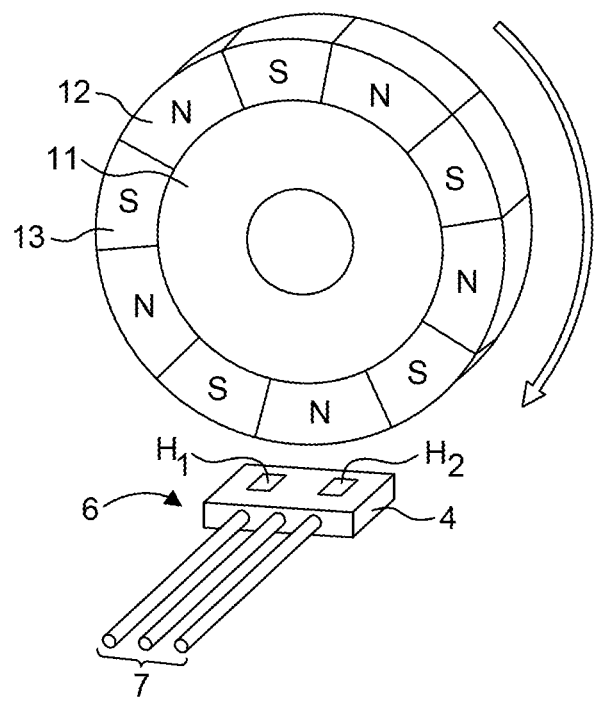
FIG. 1D illustrates a diagram of a magnetic field sensing principle using a second type of magnetic encoder according to one or more embodiments.

FIG. 1D illustrates a magnetic field sensing principle using a second type of magnetic encoder, a magnetized encoder wheel, according to one or more embodiments. The sensor module 6 includes sensor arrangement 4 having a sensor circuit (not shown) and two differential magnetic field sensor elements, Hall plate H1 and Hall plate H2. The sensor signals of each differential sensor element H1 and H2 is provided to the sensor circuit that calculates a differential measurement signal using a differential calculation that may be used to cancel out homogeneous stray-fields in the sensor plane directions.

In addition, the differential sensor elements H1 and H2 may be disposed at a distance of about half of the pitch of the poles of the magnetized encoder wheel 11 in order to generate a differential measurement signal with high signal to noise ratio. A pitch is the distance along a pitch circle between two poles of the same polarity (i.e., between two adjacent positive poles or two adjacent negative poles) for a magnetized encoder wheel.

The magnetized encoder wheel 11 comprises alternating north pole sections 12 and south pole sections 13. Accordingly, the north pole sections 12 and south pole sections 13 represent teeth and notches of a tooth and notch wheel 1 described above. The sensor elements H1 and H2 of sensor arrangement 4, as described in reference to FIG. 1C, are sensitive to magnetic fields influenced by the north pole sections 12 and south pole sections 13 of the wheel 11. Here, since the magnetic field is actively generated by the wheel 11, a back bias magnet can be omitted. A sensor output corresponds to the rotational speed of the magnetized encoder wheel 11 by detecting the change of the alternating magnetic field in a similar manner described with respect to FIG. 1C. Thus, the sensor circuit of the sensor arrangement 4 generates a sensor output to be output by one of the leads 7.

Figure 2:
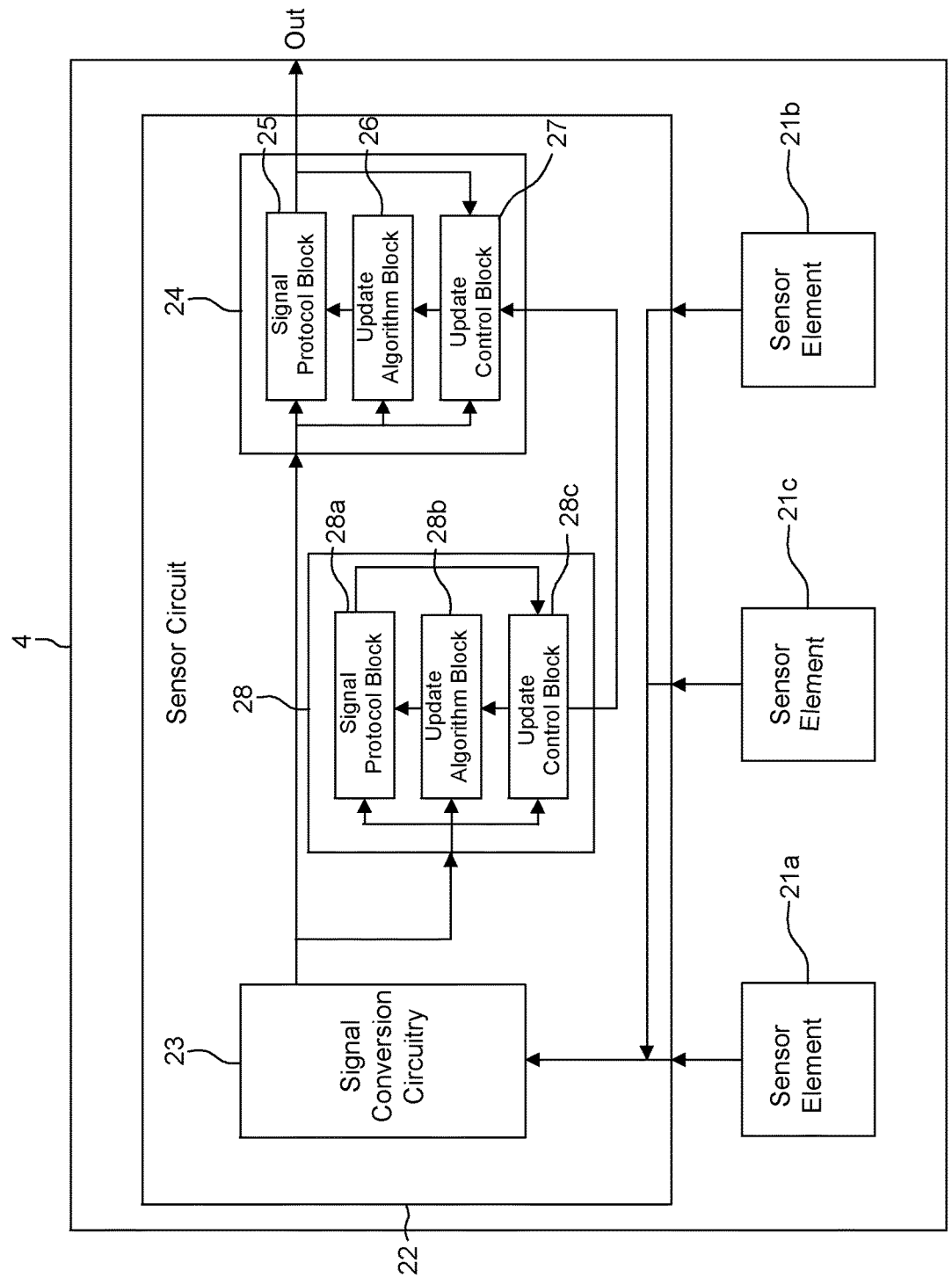
FIG. 2 illustrates a schematic block diagram of a magnetic sensor according to one or more embodiments.

FIG. 2 illustrates a schematic block diagram of a magnetic sensor according to one or more embodiments. In particular, FIG. 2 shows the sensor arrangement 4 that includes magnetic field sensor elements 21a-21c that generate sensor signals in response to a magnetic field. Sensor signals from the magnetic field sensor elements 21a and 21b are used to generate a differential measurement signal used as a speed signal and sensor signals from the magnetic field sensor element 21c are used to generate a direction signal.

The direction signal may be a differential measurement signal that is generated by using one or both of the sensor signals generated by the sensor elements 21a and 21b, or the sensor element 21c may be used as a monocell for generating the direction signal. The direction signal has a same frequency as the speed signal, but shifted in phase from the speed signal. For example, the direction signal may be shifted 90° from the speed signal and a direction of rotation of the target object can be determined therefrom by the sensor circuit based on whether the phase shift is a positive or a negative 90° (i.e., via the direction of the phase shift).

The sensor arrangement 4 further includes a sensor circuit 22 that includes signal conversion circuitry 23 configured to receive analog sensor signals from the magnetic field sensor elements 21a-21c and perform signal conditioning thereon, including an analog-to-digital conversion by an ADC. Thus, the signal conversion circuitry 23 is configured to convert the analog sensor signals into digital sensor signals and to generate the measurement signals (e.g., the speed measurement signal and the direction measurement signal) therefrom.

The measurement signals are then provided by the signal conversion circuitry 23 to the primary processing circuitry 24 and the secondary processing circuitry 28. The primary processing circuitry 24 may be responsible for processing the measurement signals and generating an output signal, whereas the secondary processing circuitry 28 may provide a second signal path used for monitoring a state of the primary processing circuitry 24. For example, the secondary processing circuitry 28 may perform a watchdog function.

Both the primary processing circuitry 24 and the secondary processing circuitry 28 are configured to perform digital signal processing using the measurement signals and include one or more processors and/or logic blocks that performs various signal conditioning functions, such as absolute signal conversion, normalization, linearization, and so forth.

The primary processing circuitry 24 includes a signal protocol block 25, an update algorithm block 26, and an update control block 27. Each block may receive measurement signals from the signal conversion circuitry 23, and may include one or more processors, or may represent a sub-circuit of a processor and/or logic block of the primary processing circuitry 24. In addition, the update control block 27 may include a controller (e.g., a microcontroller) configured to receive one or more input signals and to generate a control signal based thereon.

The measurement signals are used by the signal protocol block 25 to generate an output signal that is ultimately output by the sensor arrangement 4 to an external device (e.g., an ECU). The pulses of an output signal may be generated by the signal protocol block 25 upon the detection of a crossing of a switching point (i.e., a switching threshold) of the speed measurement signal provided by the signal conversion circuitry 23. Thus, the signal protocol block 25 includes a switching mechanism configured to change a logic value of the output signal based on the oscillation of the magnetic field and the configured switching point. The switching point, stored in memory of the sensor circuit 22, is located between the minimum (min) and the maximum (max) of the magnetic field B.

Furthermore, the update algorithm block 26 includes an update algorithm stored in memory of the of the sensor circuit 22 and further includes additional processing circuitry that performs an update function according to the update algorithm. Based on the update algorithm, the update algorithm block 26 may regularly and autonomously (re) calculate the switching point (i.e., an offset thereof) or a measurement signal offset implemented by the signal protocol block 25, and self-calibrate the switching point or the measurement signal offset implemented by the signal protocol block 25 based on an average of one or more minima and one or more maxima of the measured magnetic field (i.e., based on the average of the extrema of the speed measurement signal). Thus, the update algorithm block 26 may be configured to provide an updated switching point or an updated measurement signal offset to the signal protocol block 25, and the signal protocol block 25 may incorporate the updates for generating the output signal.

Additionally, the primary processing circuitry 24 includes update control block 27 that receives and monitors the measurement signals generated by the signal conversion circuitry 23. Based on this monitoring, the update control block 27 controls the update algorithm block 26 to either enable or disable the update function performed by the update algorithm block 26. Thus, the update control block 27 may be configured to generate an enable control signal or a disable control signal, and transmit the corresponding control signal to the update algorithm block 26 to enable or disable the update function. While the update algorithm block 26 is disabled, the signal protocol block 25 does not receive any updates from the update algorithm block 26.

The secondary processing circuitry 28 may provide a second signal path used for controlling a state of the primary processing circuitry 24, namely an enabled or disabled state of the update algorithm block 26. The secondary processing circuitry 28 may include a processing chain 28a, 28b, and 28c, similar to that of blocks 25, 26, and 27, respectively, included the primary processing circuitry 24. Thus, the secondary processing circuitry 28 may include a signal protocol block 28a, an update algorithm block 28b, and an update control block 28c that perform similar functions to those performed by blocks 25, 26, and 27 of the primary processing circuitry 24.

In particular, the secondary processing circuitry 28 may receive and monitor the measurement signals generated by the signal conversion circuitry 23, and, under certain conditions, may override a disabled state of the update algorithm block 26. For example, an update control block 28c of the secondary processing circuitry 28 may instruct the update control block 27 to re-enable the update algorithm block 26. These conditions will be described below.

Figure 3:
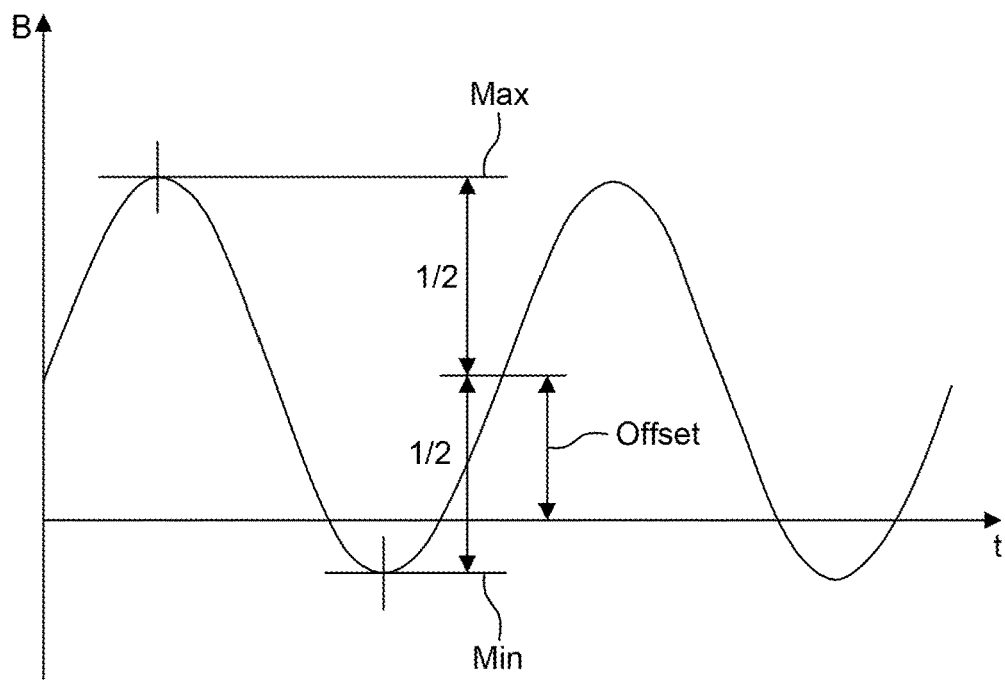
FIG. 3 illustrates a diagram of a measurement signal generated by a sensor circuit according to one or more embodiments.

FIG. 3 illustrates an example of a measurement signal generated by the signal conversion circuitry 23 according to one or more embodiments. The measurement signal may be a differential measurement signal, derived from two sensor signals using differential calculus as described above with respect to FIGS. 1C and 1D. The measurement signal is a measurement of the magnetic field B sensed over time t by the magnetic sensor, and oscillates between two extrema (e.g., minimum and maximum) as the magnetic encoder rotates. Furthermore, the measurement signal may have an offset from an x-axis in a y-axis direction, and may further be normalized by processing performed by the sensor circuit 22 (e.g., by the signal protocol block 25).

Figure 4:
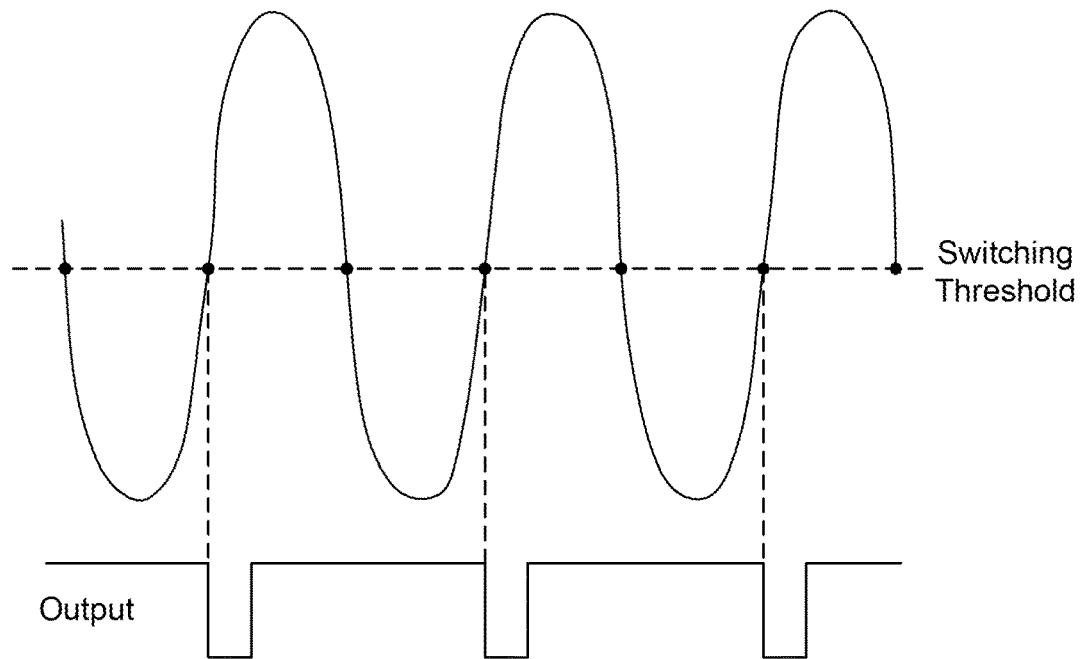
FIG. 4 illustrates an example of a pulsed output signal generated by a magnetic speed sensor according to one or more embodiments.

FIG. 4 illustrates an example of a pulsed output signal generated by a magnetic speed sensor according to one or more embodiments. In particular, the upper waveform represents a speed measurement signal that is compared to a switching threshold used to generate the pulsed output signal. The switching threshold is a switching point at which the sensor circuit 22 switches between the high and the low state (or vice versa) of its output when the crossing of the switching point is detected.

In FIG. 4, an output signal is pulsed when the speed measurement signal crosses switching threshold from one direction (e.g., on a rising edge of the measurement signal). However, the signal protocol block 25 may be configured such that the output signal is pulsed when the speed measurement signal crosses the switching threshold from either direction (e.g., one a rising or falling edge). Alternatively, the output may be switched from logic low to high on a first rising edge of the speed measurement signal and from logic high to low on a first falling edge of the speed measurement signal, or vice versa, where the rising and the falling edges occur at a switching threshold crossing. Thus, pulses in the output signal may be triggered in multiple ways.

The switching point (i.e., the switching threshold), stored in memory, is located between the minimum (min) and the maximum (max) of the magnetic field B. In some examples, two or more switching points may be stored in memory and used for generating the pulses in the output signal.

Furthermore, the sensor circuit 22 may use an update algorithm stored in a processor of the update algorithm block 26 to regularly and autonomously (re)calculate a switching point or switching threshold (i.e., an offset thereof), and self-calibrate the switching point implemented by the signal protocol block 25. As noted above, the calibration may be based on an average of one or more minima and one or more maxima of the measured magnetic field. For example, a switching point may be calculated as an average of the most recent minimum and maximum values of the speed measurement signal, and adjusted accordingly. The most recent minimum and maximum values may be used from the most recent full revolution of the target object (e.g., crankshaft).

By adapting the switching point on a continual basis, the accuracy of the switching point is maintained in a desired region in accordance with fast changes of the measurement signal and assures that a good jitter performance is achieved.

In a similar application, the update algorithm block 26 may use an update algorithm to regularly and autonomously (re)calculate an offset of the speed measurement signal so that the measurement signal is centered on the switching threshold. Here, the update algorithm block 26 is configured to track the variation of the measurement signal to detect maximum and minimum values and uses the update algorithm to ensure the speed measurement signal is centered on zero. If the speed measurement signal is not centered on zero, the offset of the speed measurement signal may be adjusted using the update algorithm such that the signal is centered on zero (i.e., the speed sensor 4 adjusts the signal to have a zero offset).

In this way, the one or more switching points are appropriately aligned on the speed measurement signal such that output pulses are generated at the appropriate switching threshold crossing. For example, a zero-crossing switching threshold may be aligned to be exactly in the middle of the speed measurement signal (i.e., half-way between the maximum and minimum signal amplitudes).

The update algorithm block 26 may be configured to perform an update once per revolution. The update algorithm block 26 may determine a revolution based on counting the number of extrema of the speed measurement signal. The number of extrema (maximum and minimum signal events) counted represents a number of teeth. For example, the target object may have 58 teeth which is known to the update algorithm. Once a complete revolution has occurred, the update algorithm block 26 may use the speed measurement signal over the course of that revolution in the manner described above to perform an update to either the switching threshold or to the offset.

As noted above, the measurement of the magnetic field may be done differentially between two magnetic field sensor elements (e.g., Hall or XMR sensors) placed in a distance of about half of the pitch of the poles or teeth of an encoder wheel in order to generate a speed measurement signal with high signal to noise ratio. The sensor circuit 22 switches between a high state and a low state of its output when a threshold crossing is detected. Alternatively, the sensor circuit 22 may deliver a pulse of known length if the threshold crossing is detected. In some systems, the pulse length may be varied via pulse width modulation, for example, in order to deliver additional information such as an indication of sufficient magnetic field strength, rotation direction, or error flags. In other systems, this kind of information may be transmitted by a short Manchester protocol following each output pulse.

In the event that the target object is a crankshaft in an HEV, it is noted above that while the vehicle is moving with the electric engine, the combustion engine is turned off and the crankshaft is mechanically disengaged, referred to as being in a dead position. This makes the crankshaft free (or almost free) to rotate about its axis during this time.

Due to the vibrations within the moving vehicle, the crankshaft may rotate randomly, backward and/or forward. During this time, the sensor elements of the sensor arrangement 4 may still measure a change in the magnetic field caused by the moving crankshaft and generate sensor signals based these measurements. In this case, the crankshaft may rotate at a low frequency in one or both rotation directions and/or may randomly change rotation directions (i.e., switch between clockwise and counter-clockwise rotations).

If this free movement occurs long enough and the shaft moves continuously backward and/or forward, the update algorithm block 26 may detect maximum and minimum events and perform an update to the offset and/or to the switching points based on these "false" maximum and minimum events. This may lead to the signal protocol block 25 generating wrong pulses (too many forward or too many backward pulses) and sending misinformation to the ECU, which may further lead to a loss of sync with the crankshaft at the system level.

Thus, the update algorithm should be modified in order to prevent the update algorithm block 26 from updating the offset or the switching points based on incorrect sensor information that may occur when the electric engine is on and the combustion engine is off.

Here, the update control block 27 is configured to disable the update function (e.g., the offset update) when the measured frequency of the speed measurement signal is below a certain limit (i.e., a frequency threshold). Since the engine is off, the detected movement is only due to unwanted movement of the crankshaft. As noted above, the crankshaft may rotate at a low frequency when disengaged. Engine idle speed, which defines a lower portion of the normal operation range of the engine, typically generates a rotation frequency in the crankshaft between 600-800 Hz when engaged. Thus, a low frequency may be regarded as a frequency that is less than 600 Hz, and more specifically, less than 400 Hz. The frequency threshold may be is selected between 100 Hz and 600 Hz depending on the manufacturer, and, more particularly, between 100 Hz and 400 Hz.

Thus, the update control block 27 is configured to monitor the frequency of the speed measurement signal (e.g., the differential measurement signal), and disable the update function of the update algorithm block 26 when the measured frequency of the speed measurement signal is below the frequency threshold. Furthermore, the update control block 27 may enable or re-enable the update function of the update algorithm block 26 when the measured frequency in the speed measurement signal is equal to or greater than the frequency threshold.

In another example, the update control block 27 is configured to disable the update function (e.g., the offset update) when the measured frequency of the measurement signal is below a certain limit (i.e., a frequency threshold) and when the rotation direction of the crankshaft has recently changed.

In particular, the update control block 27 may be configured to determine a rotational direction of the crankshaft based on comparing the phase of the speed measurement signal and the phase of the direction measurement signal. Thus, the rotation direction of the magnetic field can be determined. Alternatively, the signal protocol block 25 may perform this analysis, and provide a direction indication to the update control block 27.

The update control block 27 may track (i.e., count) the number N of consecutive switching events (i.e., output pulses or extrema of the speed measurement signal) that occur in the same rotational direction and compare this number to a switching event threshold. Here, the update control block 27 may use the number of consecutive pulses of the output signal that occur in the same rotation direction or the number of consecutive extrema of the speed measurement signal that occur in the same rotation direction as the number N of consecutive switching events. The number of extrema may be a number of maximum extrema, minimum extrema, or both.

The switching event threshold may be, for example, ten consecutive switching events that occur in the same rational direction. However, this number is entirely configurable, and may be based on a number of teeth required to pass by the sensor 4 that is sufficient to indicate that the crankshaft is undergoing a controlled rotational movement (e.g., due to the combustion engine being on).

For example, if the number N of consecutive switching events is less than the switching event threshold, then a condition to disable the update function is satisfied. On the other hand, if the number N of consecutive switching events is equal to or greater than the switching event threshold, then a condition to enable the update function is satisfied. Thus, a consecutive number of N switching events with same rotational direction are to be detected before the offset update is enabled. This condition may also be one of two conditions that must be met. For example, this condition may be applied in conjunction with the frequency condition noted above, where both conditions must pass before the update function is enabled by the update control block 27.

The secondary processing circuitry 28 may provide a second signal path used for controlling a state of the primary processing circuitry 24, namely an enabled or disabled state of the update algorithm block 26. The secondary processing circuitry 24 may receive and monitor the measurement signals generated by the signal conversion circuitry 23, and, under certain conditions, may override a disabled state of the update algorithm block 26. For example, the secondary processing circuitry 28 may instruct the update control block 27 to re-enable the update algorithm block 26. In addition, the secondary processing circuitry 28 may reset the update control block 27.

Normally, when enabled, the update algorithm block 26 may be configured to provide an update once per revolution. However, if the offset is not updated, this situation could be due to an incorrectly set switching threshold that is causing the update algorithm block 26 to be disabled for an extended period of time. For example, an incorrectly set switching threshold may result in a low frequency being detected and maintained. This may prevent the offset update from being re-enabled even if the actual rotation frequency of the crankshaft is equal to or greater than the frequency threshold described above. That is, a low frequency may be detected even when the crankshaft is rotating at a high frequency (i.e., at a normal operation frequency). Thus, the secondary processing circuitry 28 provides a means to come out of the dead lock.

For example, the signal protocol block 28a may generate a second pulsed output signal, and provide the second pulsed output signal to the update control block 28c. Also, either the signal protocol block 28a or the update control block 28c may determine a rotation direction of the crankshaft, as similarly described with respect to the signal protocol block 25 and the update control block 27. Using the second pulsed output signal and the determined rotation direction, the update control block 28c may track (i.e., count) the number N of consecutive switching events (i.e., output pulses or extrema of the speed measurement signal) that occurs in the same rotational direction and compare this number to a switching event threshold.

The update control block 28c may use the number of consecutive pulses of the second pulsed output signal that occurs in the same rotation direction or the number of consecutive extrema of the speed measurement signal that occurs in the same rotation direction as the number N of consecutive switching events.

The switching event threshold may be, for example, ten consecutive switching events that occur in the same rational direction. However, this number is entirely configurable, and may be based on a number of teeth required to pass by the sensor 4 that is sufficient to indicate that the crankshaft is undergoing a controlled rotational movement (e.g., due to the combustion engine being on).

If this condition is met, then the update control block 28c may generate a control signal to re-enable the update algorithm block 26. For example, the update control block 28c may instruct the update control block 27 to re-enable the update algorithm block 26. The update control block 27 may then re-enable the update algorithm block 26 if the update algorithm block 26 is currently disabled.

Accordingly, the secondary processing circuitry 28 is a watchdog circuit that operates in parallel to a primary processing chain (i.e., blocks 25, 26, and 27) of the primary processing circuitry 24 of the sensor circuit. The watchdog circuit is configured override a disabled state of the offset update algorithm set by the primary processing chain in order to re-enable the offset update algorithm. In this way, a prolonged duration in which the update algorithm block 26 is disabled can be avoided.

As noted above, the above examples may be used in any combination unless explicitly stated otherwise. Furthermore, it will be appreciated that other arrangements of sensor elements, other types of encoders, and other rule sets not explicitly described are possible.

While the above embodiments are described in the context of detecting a wheel or camshaft speed, the sensor may be used to detect the rotation speed of any rotating member or object that creates sinusoidal variations in a magnetic field as it rotates and that may be sensed by a sensor. For example, a combination of a ferrous wheel and a back bias magnet may be used to generate a time varying magnetic field. Alternatively, an active encoder wheel (without a back bias magnetic) may be used to generate a time varying magnetic field.

Further, while various embodiments have been described, it will be apparent to those of ordinary skill in the art that many more embodiments and implementations are possible within the scope of the invention. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A magnetic sensor module configured to measure a magnetic field whose magnitude oscillates between a first extrema and a second extrema, the magnetic sensor module comprising:
   a magnetic sensor including a plurality of sensor elements configured to generate measurement values in response to sensing the magnetic field; and
   a sensor circuit configured to:
      receive the measurement values from at least one of the plurality of sensor elements, and generate a measurement signal based on the measurement values received from the at least one of the plurality of sensor elements,
      compare the measurement signal to a switching threshold, and generate a pulsed output signal having pulses that are generated based on the measurement signal crossing the switching threshold,
      measure a first characteristic of the measurement signal and update an offset of the switching threshold according to an offset update algorithm based on the measured first characteristic of the measurement signal, and
      selectively enable and disable the offset update algorithm based on at least a second characteristic of the measurement signal.

2. The magnetic sensor module of claim 1, wherein the first characteristic of the measurement signal is an average value of at least one first extrema of the measurement signal and at least one second extrema of the measurement signal.

3. The magnetic sensor module of claim 2, wherein the sensor circuit is configured to update the offset of the switching threshold by adjusting the offset to coincide with the average value.

4. The magnetic sensor module of claim 1, wherein:
   the second characteristic of the measurement signal is a frequency of the measurement signal, and
   the sensor circuit is configured to measure the frequency of the measurement signal, compare the frequency of the measurement signal to a frequency threshold, and disable the offset update algorithm on a condition that the frequency of the measurement signal is less than the frequency threshold.

5. The magnetic sensor module of claim 4, wherein the sensor circuit is configured to enable the offset update algorithm on a condition that the frequency of the measurement signal is equal to or greater than the frequency threshold.

6. The magnetic sensor module of claim 4, wherein:
   the sensor circuit is configured detect a rotation direction of the magnetic field, count a number of consecutive pulses of the pulsed output signal that occur in a same rotation direction of the magnetic field, compare the number of consecutive pulses to a switching event threshold, and disable the offset update algorithm on a condition that the number of consecutive pulses is less than the switching event threshold.

7. The magnetic sensor module of claim 6, wherein:
   the sensor circuit is configured to enable the offset update algorithm on a condition that the frequency of the measurement signal is equal to or greater than the frequency threshold and on a condition that the number of consecutive pulses is equal to or greater than the switching event threshold.

8. The magnetic sensor module of claim 1, wherein:
   the second characteristic of the measurement signal is a number of consecutive extrema of the measurement signal that occur in a same rotation direction of the magnetic field,
   wherein the sensor circuit is configured detect a rotation direction of the magnetic field, count the number of consecutive extrema of the measurement signal that occur in the same rotation direction of the magnetic field, compare the number of consecutive extrema to a switching event threshold, and disable the offset update algorithm on a condition that the number of consecutive extrema is less than the switching event threshold.

9. The magnetic sensor module of claim 8, wherein the sensor circuit is configured to enable the offset update algorithm on a condition that the number of consecutive extrema is equal to or greater than the switching event threshold.

10. The magnetic sensor module of claim 1, wherein:
the sensor circuit includes a watchdog circuit that operates in parallel to a primary processing chain of the sensor circuit, the watchdog circuit being configured override a disabled state of the offset update algorithm set by the primary processing chain in order to re-enable the offset update algorithm,
the watchdog circuit being configured detect a rotation direction of the magnetic field, count a number of consecutive pulses of the pulsed output signal that occur in a same rotation direction of the magnetic field, compare the number of consecutive pulses to a switching event threshold, and re-enable the offset update algorithm when the number of consecutive pulses is equal to the switching event threshold.

11. The magnetic sensor module of claim 1, wherein the sensor circuit is configured to update the offset of the switching threshold thereby changing a value of the switching threshold according to the offset update algorithm and based on the measured first characteristic of the measurement signal.

12. The magnetic sensor module of claim 11, wherein:
while the offset update algorithm is enabled, the sensor circuit is configured to periodically update the offset of the switching threshold thereby changing the value of the switching threshold, and
while the offset update algorithm is disabled, the sensor circuit is configured to maintain a current offset of the switching threshold thereby maintaining the value of the switching threshold.

13. The magnetic sensor module of claim 12, wherein:
while the offset update algorithm is disabled, the sensor circuit is configured to maintain the current offset of the switching threshold thereby maintaining the value of the switching threshold regardless of the measured first characteristic of the measurement signal.

14. A method of measuring a magnetic field whose magnitude oscillates between a first extrema and a second extrema, the method comprising:
generating a measurement signal representing the measured magnetic field;
comparing the measurement signal to a switching threshold;
generating a pulsed output signal having pulses that are generated based on the measurement signal crossing the switching threshold;
measure a first characteristic of the measurement signal;
updating an offset of the switching threshold according to an offset update algorithm based on the measured first characteristic of the measurement signal; and
selectively enabling and disabling the offset update algorithm based on at least a second characteristic of the measurement signal.

15. The method of claim 14, wherein the first characteristic of the measurement signal is an average value of at least one first extrema of the measurement signal and at least one second extrema of the measurement signal.

16. The method of claim 15, wherein updating the offset of the switching threshold includes updating the offset of the switching threshold by adjusting the offset to coincide with the average value.

17. The method of claim 14, wherein:
the second characteristic of the measurement signal is a frequency of the measurement signal, the method further comprising:
measuring the frequency of the measurement signal;
comparing the frequency of the measurement signal to a frequency threshold; and
disabling the offset update algorithm on a condition that the frequency of the measurement signal is less than the frequency threshold.

18. The method of claim 17, further comprising:
enabling the offset update algorithm on a condition that the frequency of the measurement signal is equal to or greater than the frequency threshold.

19. The method of claim 17, further comprising:
detecting a rotation direction of the magnetic field;
counting a number of consecutive pulses of the pulsed output signal that occur in a same rotation direction of the magnetic field;
comparing the number of consecutive pulses to a switching event threshold; and
disabling the offset update algorithm on a condition that the number of consecutive pulses is less than the switching event threshold.

20. The method of claim 19, further comprising:
enabling the offset update algorithm on a condition that the frequency of the measurement signal is equal to or greater than the frequency threshold and on a condition that the number of consecutive pulses is equal to or greater than the switching event threshold.

21. The method of claim 14, wherein:
the second characteristic of the measurement signal is a number of consecutive extrema of the measurement signal that occur in a same rotation direction of the magnetic field, the method further comprising:
detecting a rotation direction of the magnetic field;
counting the number of consecutive extrema of the measurement signal that occur in the same rotation direction of the magnetic field;
comparing the number of consecutive extrema to a switching event threshold; and
disabling the offset update algorithm on a condition that the number of consecutive extrema is less than the switching event threshold.

22. The method of claim 21, further comprising:
enabling the offset update algorithm on a condition that the number of consecutive extrema is equal to or greater than the switching event threshold.

23. The method of claim 14, further comprising:
disabling the offset update algorithm by a primary processing chain;
operating a watchdog function in parallel to the primary processing chain; and
overriding a disabled state of the offset update algorithm set by a primary processing chain via the watchdog function to re-enable the offset update algorithm.

* * * * *